United States Patent
Blanchard et al.

(10) Patent No.: US 10,181,509 B2
(45) Date of Patent: Jan. 15, 2019

(54) INSULATED GATE POWER DEVICES WITH REDUCED CARRIER INJECTION IN TERMINATION AREA

(71) Applicant: Pakal Technologies, LLC, San Francisco, CA (US)

(72) Inventors: Richard A. Blanchard, Los Altos, CA (US); Hidenori Akiyama, Miyagi (JP); Vladimir Rodov, Seattle, WA (US); Woytek Tworzydlo, Austin, TX (US)

(73) Assignee: PAKAL TECHNOLOGIES, LLC, San Francisco, CA (US)

( * ) Notice: Subject to any disclaimer, the term of this patent is extended or adjusted under 35 U.S.C. 154(b) by 9 days.

(21) Appl. No.: 15/228,788

(22) Filed: Aug. 4, 2016

(65) Prior Publication Data

US 2017/0047395 A1 Feb. 16, 2017

Related U.S. Application Data

(60) Provisional application No. 62/204,721, filed on Aug. 13, 2015.

(51) Int. Cl.
*H01L 29/06* (2006.01)
*H01L 29/739* (2006.01)
(Continued)

(52) U.S. Cl.
CPC ........ *H01L 29/0623* (2013.01); *H01L 21/761* (2013.01); *H01L 29/0649* (2013.01);
(Continued)

(58) Field of Classification Search
CPC ............. H01L 29/0623; H01L 29/0649; H01L 29/0834; H01L 29/36; H01L 29/66348;
(Continued)

(56) References Cited

U.S. PATENT DOCUMENTS

2014/0209970 A1* 7/2014 Schulze ................. H01L 21/04
257/139
2015/0221765 A1* 8/2015 Zeng .................... H01L 29/7813
257/139

OTHER PUBLICATIONS

Perpina et al., "Edge Termination Impact on Clamped Inductive Turn-off Failure in High-Voltage IGBTs Under Overcurrent Conditions", Proceedings of the 23rd International Symposium on Power Semiconductor Devices & IC's, May 23-26, 2011, San Diego, CA.

(Continued)

*Primary Examiner* — Brigitte A Paterson
(74) *Attorney, Agent, or Firm* — Patent Law Group LLP; Brian D. Ogonowsky

(57) ABSTRACT

A high power vertical insulated-gate switch is described that includes an active region, containing a cell array, and a surrounding termination region. The termination region is for at least the purpose of controlling a breakdown voltage and does not contain any switching cells. Assuming the anode is the silicon substrate (p-type), it is desirable to have good hole injection efficiency from the substrate in the active region in the device's on-state. Therefore, the substrate should be highly doped (p++) in the active region. It is desirable to have poor hole injection efficiency in the termination region so that there is a minimum concentration of holes in the termination region when the switch is turned off. Various doping techniques are disclosed that cause the substrate to efficiency inject holes into the active region but inefficiently inject holes into the termination region during the on-state.

9 Claims, 8 Drawing Sheets

(51) Int. Cl.
   *H01L 29/66*     (2006.01)
   *H01L 21/761*    (2006.01)
   *H01L 29/36*     (2006.01)
   *H01L 29/08*     (2006.01)
   *H01L 29/10*     (2006.01)

(52) U.S. Cl.
   CPC .......... *H01L 29/0834* (2013.01); *H01L 29/36* (2013.01); *H01L 29/66348* (2013.01); *H01L 29/7397* (2013.01); *H01L 29/1095* (2013.01)

(58) Field of Classification Search
   CPC ............. H01L 29/7397; H01L 29/1095; H01L 21/761
   See application file for complete search history.

(56) References Cited

OTHER PUBLICATIONS

Chen et al., "LPT(II)-CSTBT(III) for High Voltage Application with Ultra Robust Turn-off Capability Utilizing Novel Edge Termination Design" Proceedings of the 2012 24th International Symposium on Power Semiconductor Devices and ICs Jun. 3-7, 2012, Bruges, Belgium.

* cited by examiner

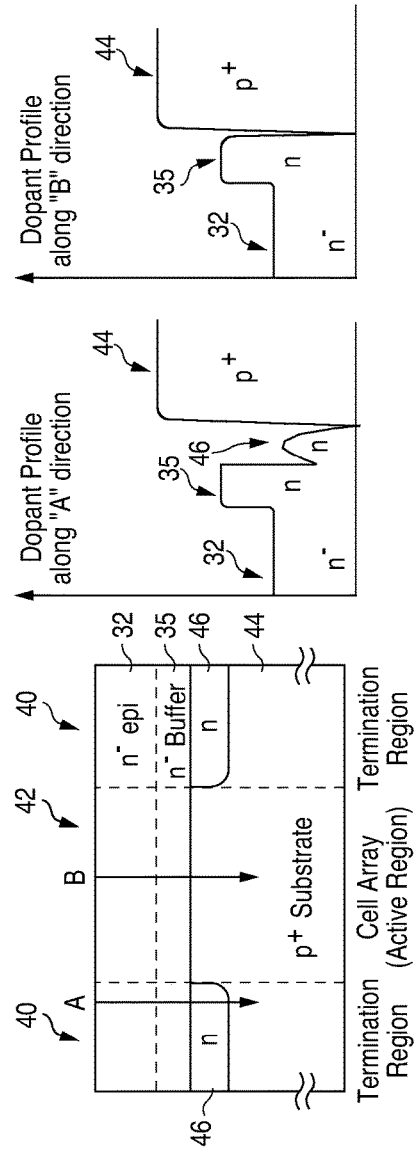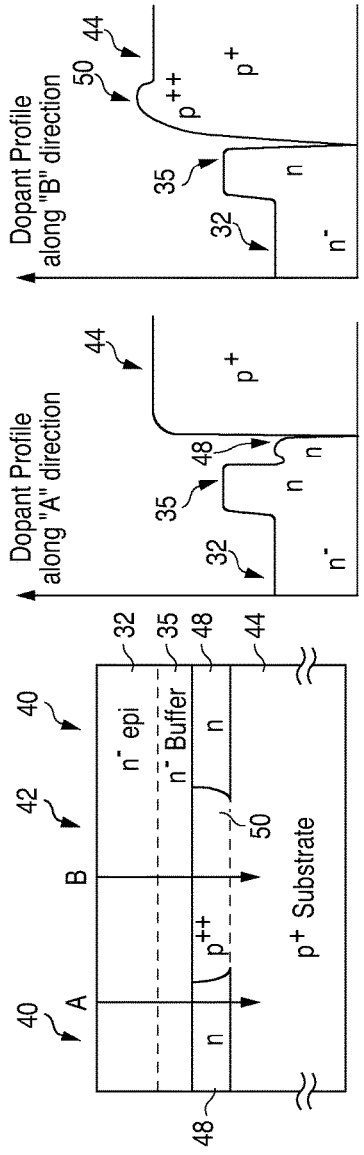

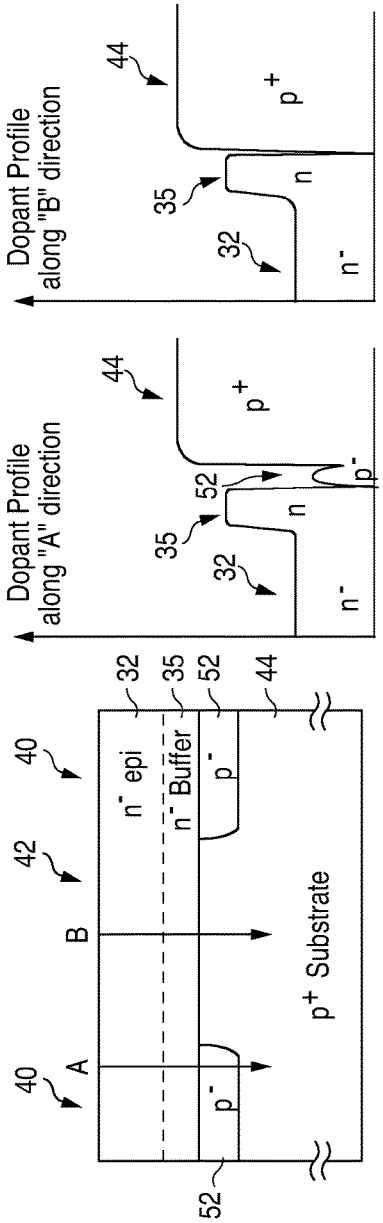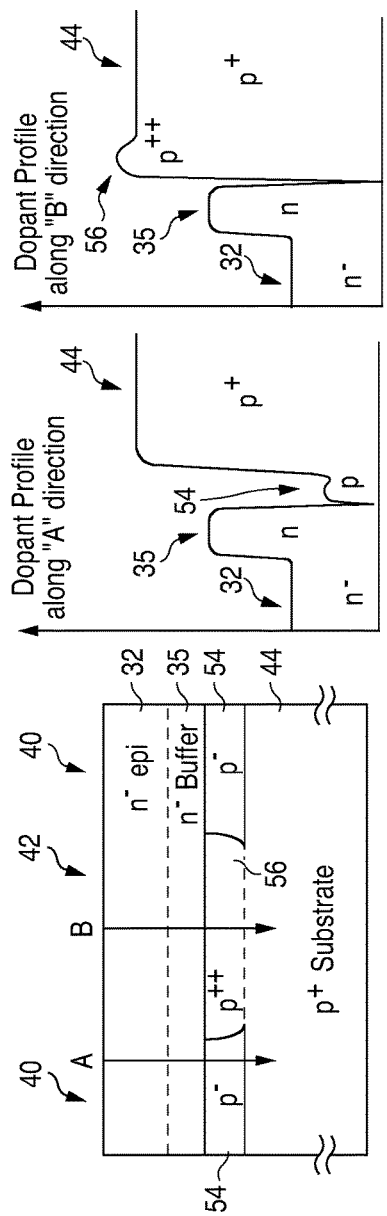

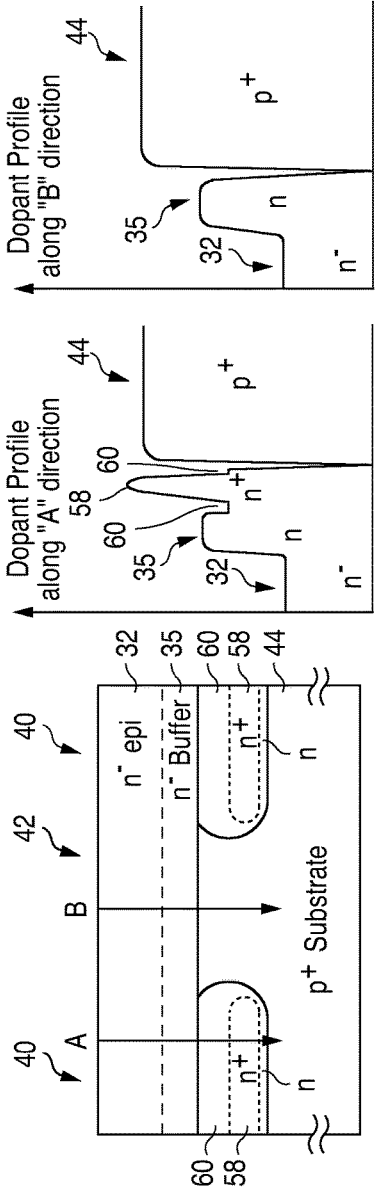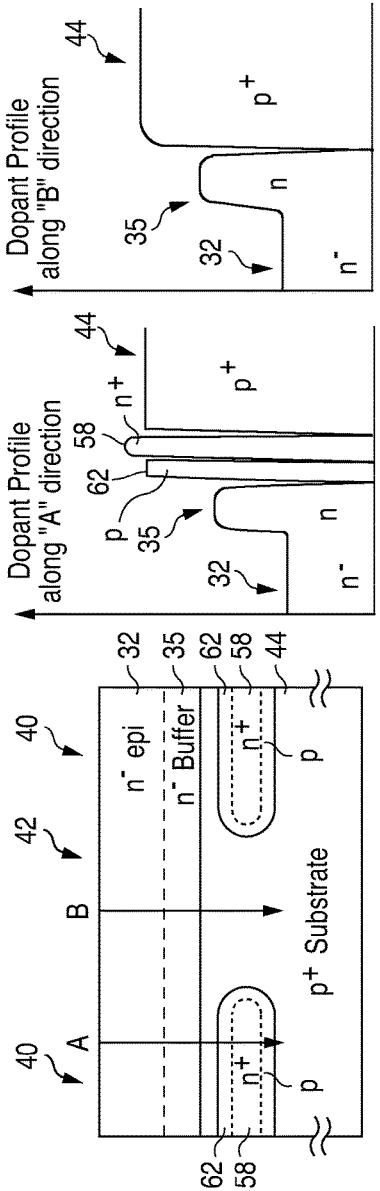

AFTER EPI GROWTH

AT THE END OF THE WAFER PROCESS

INSULATED GATE POWER DEVICES WITH REDUCED CARRIER INJECTION IN TERMINATION AREA

CROSS-REFERENCE TO RELATED APPLICATIONS

This application is based on provisional application Ser. No. 62/204,721, filed Aug. 13, 2015, by Richard Blanchard, assigned to the present assignee and incorporated herein by reference.

FIELD OF THE INVENTION

This invention relates to high power, insulated-gate-controlled devices used as switches and, more particularly, to a technique to reduce the current flow in termination regions surrounding a cellular array (active region) to prevent damage to the device when switching the device off, as well as to reduce turn-off time.

BACKGROUND

The present invention is directed to improvements in the termination region of vertical, insulated-gate-controlled devices, such as Insulated Gate Bipolar Transistors (IGBTs), Insulated Gate Turn-off Devices (IGTOs), and other related devices that switch between an on state and an off state to control power to a load, such as a motor. Such devices may conduct many amps and have a breakdown voltage in excess of 500 volts. An example of a prior art IGTO is shown in FIG. 1 to illustrate the problem with high current densities being created in the termination region surrounding the cellular array. The details of the device's operation are not important but are presented below for completeness.

Prior art FIG. 1 is a cross-section of a small portion of an IGTO device 10 (similar in some respects to a thyristor) reproduced from the assignee's U.S. Pat. No. 8,878,237, incorporated herein by reference. The portion is near an edge of the device and shows a plurality of cells having vertical gates 12 (e.g., doped polysilicon) formed in insulated trenches. A 2-dimensional array of the cells may be formed in a common p-well 14, and the cells are connected in parallel. The area containing the cells is shown as the active region 15. The edge of the device suffers from field crowding, and the edge cell is modified to increase ruggedness of the device. The edge cell has an opening 16 in the n+ source region 18 where the cathode electrode 20 shorts the n+ source region 18 to the p-well 14. Such shorting increases the tolerance to transients to prevent unwanted turn on and prevents the formation of hot spots. The configuration of the edge cell may also be used in other cells of the device for a more uniform current flow across the device.

The vertical gates 12 are insulated from the p-well 14 by an oxide layer 22. A p+ contact (not shown) may be used at the opening 16 of the edge cell for improved electric contact to the p-well 14. The narrow gates 12 are connected together outside the plane of the drawing and are coupled to a gate voltage via the gate electrode 25 contacting the polysilicon portion 28. A patterned dielectric layer 26 insulates the metal from the various regions. The field limiting rings 29 at the edge of the cell in the termination region 27 reduce field crowding for increasing the breakdown voltage. The termination region 27 is designed to break down at a voltage higher than the breakdown voltage of the active region 15, since the cathode electrode 20 is over the active region 15 and can efficiently conduct the breakdown current. The termination region 27 surrounds the active region 15, which may have a generally rectangular shape. The active region 15 may take up the center area of a die or may be formed in strips separated by termination regions 27.

An NPNP semiconductor layered structure is formed in FIG. 1. There is a bipolar PNP transistor formed by a p+ substrate 30, an n-epitaxial (epi) layer 32, and the p-well 14. There is also a bipolar NPN transistor formed by the n-epi layer 32, the p-well 14, and the n+ source region 18. An n-type buffer layer 35, which may be epitaxially grown or formed by implantation into the substrate 30, has a dopant concentration higher than that of the n-epi layer 32. The buffer layer 35 helps to set the breakdown voltage and reduces hole injection into the n-epi layer 32. A metal, bottom anode electrode 36 contacts the substrate 30, and a metal, cathode electrode 20 contacts the n+ source region 18. The p-well 14 surrounds the gate structure, and the n-epi layer 32 extends to the surface around the p-well 14.

When the anode electrode 36 is forward biased with respect to the cathode electrode 20, but without a sufficiently positive gate bias, there is no current flow, since the product of the betas (gains) of the PNP and NPN transistors is less than one (i.e., there is no regeneration activity).

When the gate is forward biased, electrons from the n+ source region 18 become the majority carriers along the gate sidewalls in an inversion layer, referred to as a "voltage induced emitter," causing the effective width of the NPN base (the portion of the p-well 14 between the n-layers) to be reduced. As a result, the beta of the NPN transistor increases to cause the product of the betas to exceed one. This condition results in device turn-on, with holes being injected into the lightly doped n-epi layer 32 and electrons being injected into the p-well 14. Accordingly, the gate bias initiates the turn-on, and the full turn-on (due to regenerative action) occurs when there is current flow through both the NPN transistor and the PNP transistor.

When the gate bias is removed, such as the gate electrode 25 being shorted to the cathode electrode 20, the IGTO device turns off.

Applicants have discovered that, as a result of the heavily doped p+ substrate 30 below the termination region 27, there is a relatively high injection of carriers (holes) from the substrate 30 into the n-epi layer 32 (base) when the IGTO device 10 is on. When the IGBT 10 is turned from on to off, the injected carriers in the termination region 27 can result in device failure due to the high heat created when removing the excess carriers, resulting in thermal destruction in the termination region 27. This problem limits the acceptable maximum current that can be conducted in the on-state.

This general cause of device destruction due to high carrier injection into a termination region is described in the paper, "LPT(II)-CSTBT™(III) for High Voltage Application with Ultra Robust Turn-Off Capability Utilizing Novel Edge Termination Design," by Ze Chen et al., Proceedings of the 2012 24$^{th}$ International Symposium on Power Semiconductor Devices and ICs, 3-7 Jun. 2012, incorporated herein by reference. That paper describes a high voltage IGBT using an n-type substrate. All the devices in the active region are formed by doping from the top surface of the n-type substrate. The bottom p-type layer (anode) is formed by doping the bottom surface of the n-type substrate. The bottom p-type layer is formed by masking the bottom surface of the n-type substrate during implantation so that the p-type layer is heavily doped below the active region and only lightly doped below the termination region. This light doping below the termination region reduces the injected carriers (holes) in the termination region during the on-state, so that when the IGBT is turned off, there is much less heating effect from the injected carriers in the termination region.

However, such a prior art technique does not suggest how to achieve similar results in vertical gate-controlled devices where the active cell array is not formed directly in the top surface of an n-type substrate, but is formed in an n-type epitaxial layer grown over a p+ substrate. It is not feasible to dope the bottom surface of a p+ substrate to obtain different doping levels at the top surface of the substrate, where the n-type epitaxial layers are grown over the top surface of the substrate. Other problems exist when using a starting p+ substrate.

Therefore, what is needed are techniques for reducing carrier injection into the termination region of a vertical, insulated-gate device, where the active region is formed in an epitaxial layer of a first conductivity type (e.g., n-type) over a growth substrate of a second conductivity type (e.g., p-type).

SUMMARY

Various masking and doping techniques are described that reduce carrier injection into a termination region surrounding an active region (cell array) without reducing the breakdown voltage and efficiency of the vertical insulated-gate device, such as an IGBT or an IGTO device.

In one embodiment, the starting substrate is a p+ substrate. The top surface of the substrate will ultimately have various n-type layers epitaxially grown over it to fabricate the insulated-gate device. The p+ substrate bottom surface, after the substrate is thinned, may be the anode (or collector) of an IGBT or IGTO device.

In one embodiment, the top surface of the p+ substrate is masked prior to growing the n-type layers to expose the intended termination region surrounding the intended active region (cell array). N-type dopants are then implanted into the termination region to create either a very low concentration p-type layer or an n-layer below the intended termination region. The dopants implanted into the substrate are driven in by subsequent thermal processes. The area below the active region remains p+. The n-type epitaxial layers are then grown over the entire substrate, and the cell array is formed in the epitaxial layers. This structure achieves a high hole injection efficiency below the active region and a low hole injection efficiency below the termination region. Therefore, the problem with a high concentration of carriers in the termination region, when the device is switched off, is avoided.

In another embodiment, the entire top surface of the p+ substrate is doped with n-type dopants (e.g., phosphorus) to form an n-type layer or a low concentration p-type layer, and the area under the active region is doped with p-type dopants (to form a p+ or p++ type layer) to achieve a high hole injection efficiency below the active region and a low hole injection efficiency below the termination region.

In another embodiment, both arsenic (a slow diffusing n-type dopant) and phosphorus (a fast diffusing n-type dopant) are implanted in the top surface of the p+ substrate below the intended termination region to form an n-type layer (or a low concentration p-type layer) below the termination region, with an n+ region at the center of the n-type layer (or low concentration p-type layer). The p+ substrate below the active region is not affected.

In another embodiment, the top surface of the p+ substrate is masked and doped with oxygen or nitrogen below the intended termination region to form an insulating layer of silicon dioxide or silicon nitride below the termination region.

In another embodiment, the substrate is not a p+ type but only a p-type (which will be a low efficiency hole injector). Prior to the n-type epitaxial layers being grown, the top surface of the substrate corresponding to the active region is doped with p-dopants to form a p+ layer (or a p++ layer) for high efficiency hole injection below the active region. The area corresponding to the termination region is not additionally doped so remains a low efficiency hole injector. To achieve good ohmic contact with a bottom metal layer, the bottom surface of the substrate is doped with p-type dopants, after the substrate is thinned, to form a p+ (or p++) bottom layer of the substrate.

Additionally, to reduce hole injection into the termination region, the p-type substrate is masked and n-type dopants are injected into the termination region to effectively cause the n-type buffer layer to be more highly doped in the termination region than in the active region. The p-type substrate may also be masked and doped to increase the p-type concentration below the active region to increase the hole injection efficiency below the active region. Thus, the hole injection is further reduced below the termination region while the hole injection efficiency is increased below the active region.

Other embodiments are described.

The reduced injection of holes in the termination region lowers the concentration of holes in transient conditions between the on and off states of the device, thereby decreasing local power dissipation. The associated decrease in local temperature allows the device to handle a larger current without a failure.

The techniques may be used with many different types of cell arrays and termination region structures in the vertical insulated-gate device.

BRIEF DESCRIPTION OF THE DRAWINGS

FIG. 3A illustrates the simplified die structure of FIG. 2, in accordance with one embodiment of the invention, after doping the substrate and after the various layers and regions are subsequently formed.

FIG. 3B is the relative doping profile taken vertically through the termination region.

FIG. 3C is the relative doping profile taken vertically through the active region.

FIG. 4A illustrates the simplified die structure of FIG. 2, in accordance with another embodiment of the invention, after doping the substrate and after the various layers and regions are subsequently formed.

FIG. 4B is the relative doping profile taken vertically through the termination region.

FIG. 4C is the relative doping profile taken vertically through the active region.

FIG. 5A illustrates the simplified die structure of FIG. 2, in accordance with another embodiment of the invention, after doping the substrate and after the various layers and regions are subsequently formed.

FIG. 5B is the relative doping profile taken vertically through the termination region.

FIG. 5C is the relative doping profile taken vertically through the active region.

FIG. 6A illustrates the simplified die structure of FIG. 2, in accordance with another embodiment of the invention, after doping the substrate and after the various layers and regions are subsequently formed.

FIG. 6B is the relative doping profile taken vertically through the termination region.

FIG. 6C is the relative doping profile taken vertically through the active region.

FIG. 7A illustrates the simplified die structure of FIG. 2, in accordance with another embodiment of the invention, after doping the substrate and after the various layers and regions are subsequently formed.

FIG. 7B is the relative doping profile taken vertically through the termination region.

FIG. 7C is the relative doping profile taken vertically through the active region.

FIG. 8A illustrates the simplified die structure of FIG. 2, in accordance with another embodiment of the invention, after doping the substrate and after the various layers and regions are subsequently formed.

FIG. 8B is the relative doping profile taken vertically through the termination region.

FIG. 8C is the relative doping profile taken vertically through the active region.

Elements that are the same or equivalent are labelled with the same numerals.

DETAILED DESCRIPTION

The invention is directed to an improved termination region in a vertical insulated-gate device (used as a high power switch), such as an IGBT or IGTO device, and also directed to fabrication techniques for forming the termination region. The invention is particularly useful for high power devices.

Figure 1:
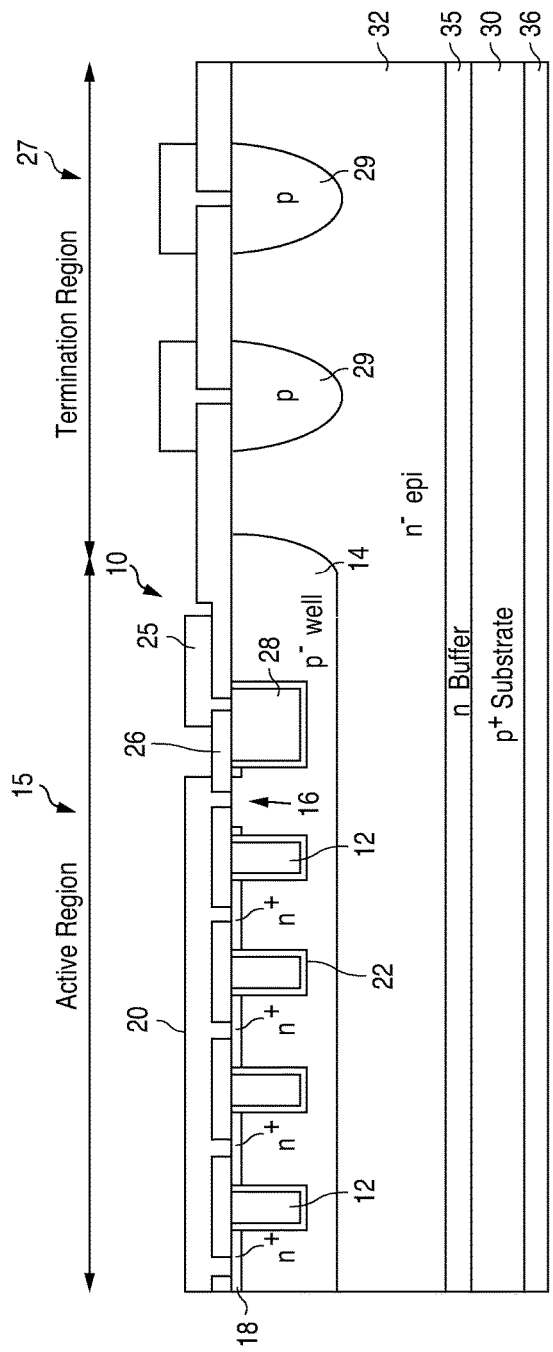
FIG. 1 is a cross-sectional view of the assignee's prior art vertical insulated-gate switch, formed as a die, used to illustrate possible active devices and termination structures that can be used in conjunction with the present invention.

In one example, the bottom metal of the device is an anode, and the top metal is a cathode, such as shown in FIG. 1. A gate metal is also formed on the top for controlling the conduction of the device. The termination region surrounds an active region, which typically contains an array of cells. Assuming the bottom layer of the device is a p+ type substrate, the substrate injects holes (carriers) into the lightly doped n-type epitaxial base layer. In the active region, having a high hole injection efficiency is desirable, since it corresponds to a low forward voltage. When the device is turned off, the injected holes are quickly "removed" via the p-well and cathode metal. There is no p-well and cathode metal in the termination region, so any injected holes in the termination region are not efficiently removed, which delays turn-off time and generates heat that may cause damage. The present invention causes a great reduction in the carrier injection into the lightly doped n-type base in the termination region to improve turn-off time and avoid excess heat.

Figure 2:
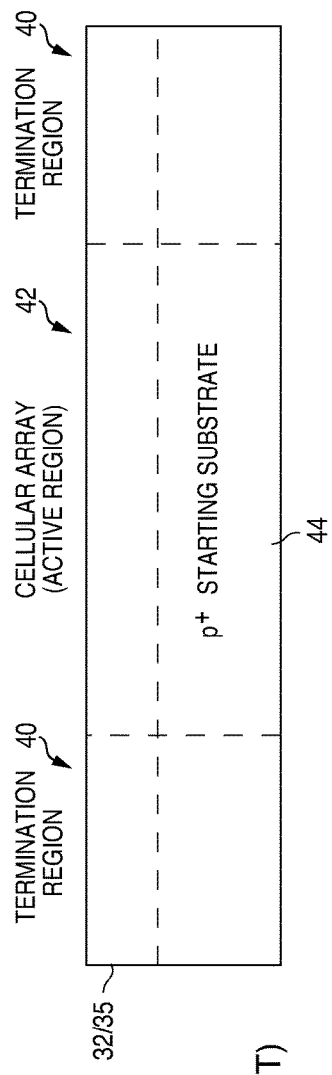
FIG. 2 is a simplified cross-sectional view of a portion of a silicon wafer corresponding to a single die of an insulated-gate switch to help explain the various doping techniques performed on the substrate prior to the growing of the epitaxial layers.

FIG. 2 is a cross-section of a small portion of a starting silicon wafer (using an intrinsic p+ substrate 44), where the portion corresponds to a single die area to be later singulated. Subsequent figures illustrate the various doping techniques for the termination region 40 to reduce the hole injection efficiency of the termination region 40. Although the doping techniques described below are performed prior to the growth of the epitaxial layers, the n-type buffer layer 35 and n-type epi layer 32 are shown, with the cellular array portion defining the active region 42 and the various termination structures surrounding the active region 42 defining the termination region 40.

The completed die will be a vertical insulated-gate switching device, such as an IGBT or an IGTO device. The device formed using the substrate 44 of FIG. 2 may be the IGTO device shown in FIG. 1, except for the modifications described herein. The center active region 42 may correspond to the cell array active region 15 in FIG. 1, and the termination region 40 may correspond to the termination region 27 in FIG. 1. The termination region 40 surrounds the active region 42 and is designed to reduce electric fields around the perimeter to improve the breakdown voltage. The termination region 40 will typically include conventional field limiting rings 29 (FIG. 1) for spreading the electric fields. The field limiting rings 29 may include field plates (not shown) to aid in spreading the electric field. The field limiting rings 29 are typically floating. Breakdown occurs first in the active region 42 to limit heat dissipation, since the cathode electrode 20 over the active region 42 efficiently conducts the breakdown current.

FIG. 3A illustrates the wafer portion of FIG. 2 after masking and doping the substrate 44 from its top surface, followed by growing an n-type buffer layer 35 and a lightly doped n-epi layer 32 (forming a base layer for a vertical PNP transistor). The layers 32 and 35 may be the same layers shown in FIG. 1. The p-well 14 and the various cells from FIG. 1 are ultimately formed in the n-epi layer 32, as described in the Assignee's U.S. Pat. No. 8,878,237. Other types of cells may be formed in the n-epi layer 32.

Prior to the growth of the epitaxial layers 32 and 35, the top surface of the substrate 44 is masked, such as with a patterned photoresist, and n-type dopants (e.g., phosphorus) are implanted to form a continuous n-type region 46 as a ring in the termination region 40. The p+ substrate 44 may have a p-type dopant concentration greater than 10E19 cm$^{-3}$. The n-type dopant concentration in the region 46 may be any amount since all that is required is to reduce the p-type dopant concentration of the substrate 44 to below its starting concentration to reduce the hole injection efficiency into the n-epi layer 32 in the termination region 40. By forming the n-type region 46, the hole injection is greatly reduced. Thus, when the device is turned off, there will be far fewer holes in the n-epi layer 32 in the termination region 40, enabling a more rapid turn-off and virtually no increased heat.

FIG. 3B shows the relative dopant concentrations in the termination region 40, starting from the top down (left side of FIG. 3B), referred to as the "A" direction. The n-dopant implant may be at any depth, while still achieving the goals of the invention. FIG. 3C shows the relative dopant concentrations in the active region 42, starting from the top down, referred to as the "B" direction. In FIG. 3C, there is no change to the conventional active region 42, so the high hole injection efficiency is not affected. The various epitaxial layers are then grown over the substrate 44 along with forming the cell array. Simulations show a great improvement in the turn-off characteristics of the device. The dopants are activated and diffused during subsequent thermal steps.

Although the n-type doping of substrate 44 in the termination region 40 does not reduce the number of p-type dopants, the effect of the added n-dopants reduces the "effective" p-type dopant concentration by cancelling the holes created by the p-type dopants.

Even though the n-type dopants are introduced through the top surface of the substrate 44, the energy level of the implant can be selected to implant the dopants at any depth below the surface and even within a range of depths. When the dopants are driven-in and diffused, they may or may not reach the top surface. However, the effect of reducing hole injection efficiency is still obtained. This applies to all embodiments described herein.

FIG. 4A illustrates another technique where, prior to the growth of the epitaxial layers, the p+ (or p++) substrate 44 is subjected to a blanket (no mask) implant of n-type dopants to form a continuous n-type layer 48 on the top surface of the substrate 44. Then, the termination region 40 is masked and p-type dopants are introduced into the substrate 44 in the active region 42 to form a center p++ region 50 to cause the substrate 44 to be a continuous p-type in the active region 42. To improve the hole injection efficiency, the p-type doping increases the p-type dopant concentration in the active region 42 to above that of the substrate 44, as shown by the dopant profiles of FIG. 4B (termination region along "A" direction) and 4C (active region along "B" direction).

FIG. 5A illustrates another technique similar to that of FIG. 3A, but where the dosage of n-type dopants is much less so as to only lower the effective p-type dopant concentration in the substrate 44 in the termination region 40. Thus, the substrate 44 surface in the active region 42 remains p+ (or p++) and the substrate 44 surface in the termination region 40 comprises the p− region 52, as shown in FIGS. 5B and 5C.

FIG. 6A illustrates another technique similar to that of FIG. 4A, but where the dosage of n-type dopants during the blanket implant is much less so as to only lower the effective p-type dopant concentration in the substrate 44 in the termination region 40 to form a p-layer 54. The substrate 44 is then masked, and the active region 42 is implanted with p-type dopants to raise the p-type dopant concentration to above that of the original substrate 44 in the p++ region 56 to improve hole injection efficiency. FIGS. 6B and 6C show the relative dopants concentrations in the "A" and "B" directions.

FIG. 7A illustrates another technique similar to FIG. 3A but where the substrate 44 is masked and fast diffusing phosphorus (an n-type dopant) is implanted in the termination region 40 followed by implanting slow diffusing arsenic (an n-type dopant). This forms an inner n+ region 58 and an outer n region 60. One benefit of this technique is that the dopant level in the termination region 40 is more controllable after the various thermal steps used in forming the device. The implants in all embodiments may be shallow or deep. FIGS. 7B and 7C show the relative dopants concentrations in the "A" and "B" directions.

FIG. 8A illustrates another technique similar to FIG. 7A but where the phosphorus dosage is much less so as to only form p− regions 62 surrounding the n+ regions 58 to lower the hole injection efficiency in the termination region 40. Therefore, there is less concern about the fast-diffusing phosphorus affecting the active region 42. FIGS. 8B and 8C show the relative dopants concentrations in the "A" and "B" directions.

Figure 9A:
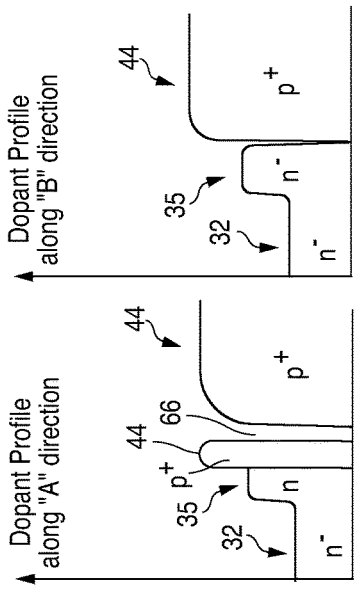
FIG. 9A illustrates the simplified die structure of FIG. 2, in accordance with another embodiment of the invention, after doping the substrate and after the various layers and regions are subsequently formed.
Figure 9B:
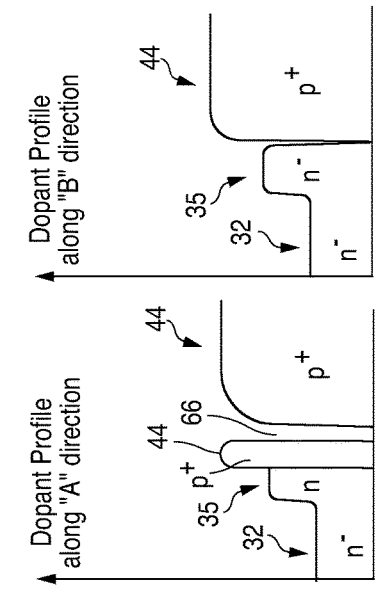
FIG. 9B is the relative doping profile taken vertically through the termination region.
Figure 9C:
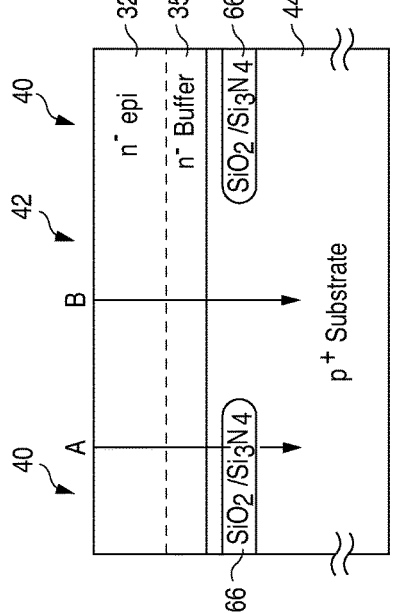
FIG. 9C is the relative doping profile taken vertically through the active region.

FIG. 9A illustrates a technique where insulating regions 66 (forming a ring) are formed in the substrate 44 in the termination region 40. The active region 42 of the substrate 44 is masked, and oxygen or nitrogen is implanted in the termination region 40 to form the silicon dioxide or silicon nitride insulating regions 66 to reduce the hole injection efficiency in the termination region 40.

Figure 10A:
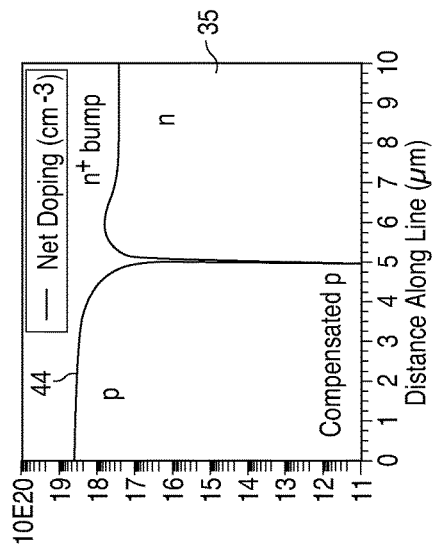
FIG. 10A is the doping profile vertically through an active region in a die in another embodiment of the invention.
Figure 10B:
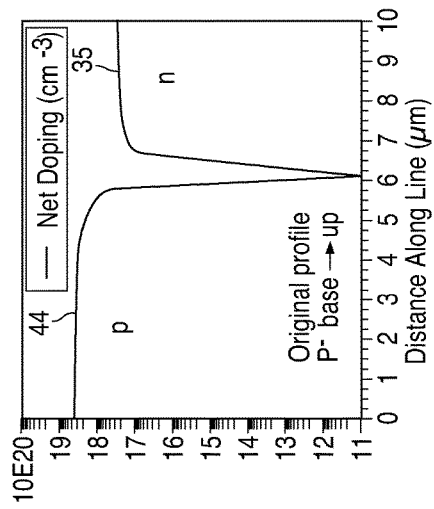
FIG. 10B is the doping profile vertically through a termination region in the die of FIG. 10A.

In the various processes describe above, the n-type implant in the substrate 44 in the termination region 40 may diffuse up into the n-type buffer layer 35 to increase its n-type dopant concentration. FIG. 10A illustrates the relative doping profile in the active region 42, with the substrate 44 doping on the left side and the n-type buffer layer 35 doping on the right side, where the n-type doping of the substrate 44 does not affect the n-type dopant concentration in the n-type buffer layer 35 in the active region 42. FIG. 10B illustrates the relative doping profile in the termination region 40, with the substrate 44 doping on the left side and the n-type buffer layer 35 doping on the right side, where the n-type doping of the substrate 44 increases the n-type dopant concentration in the n-type buffer layer 35 near the interface to reduce hole injection in the termination region 40.

In an alternative embodiment, the starting intrinsic substrate is a p-type but not highly doped. It has a p-type dopant concentration of on the order of $10E18$ cm$^{-3}$, which is considered less than a p+ type (e.g., dopant concentration greater than $10E19$/cm$^{-3}$). Prior to the growth of the epitaxial layers, the top surface of the substrate is masked to expose the active region, and additional p-type dopants (e.g., boron) are implanted to make the surface p+, while the surrounding termination region is unaffected. Since the termination region has a low concentration of p-type dopants, it has poor hole injection efficiency, while the active region, being a p+ type, has a high hole injection efficiency for good device performance in the on-state. After the epitaxial layers and cell array are formed, the p-type substrate is thinned, and the bottom surface is further doped with p-type dopants to form a bottom p+ type layer. This structure is ideal for ohmic contact with the bottom anode metal.

Figure 11A:
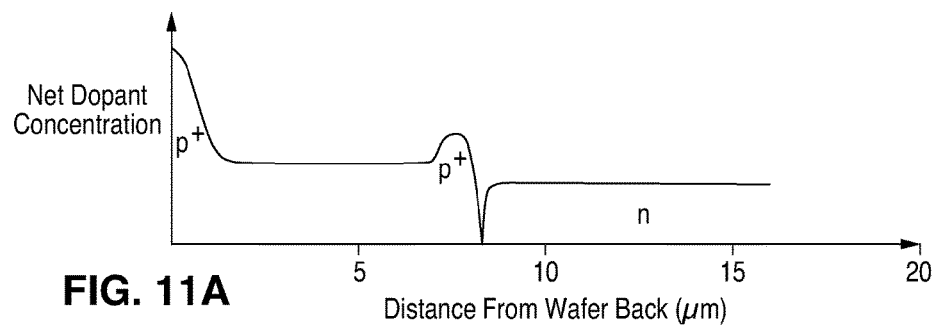
FIG. 11A is the doping profile vertically through the active region of a die, where the top and bottom surfaces of a relatively lightly doped intrinsic p-type substrate are doped with p-type dopants to form p+ layers, rather than using a starting p+ substrate. The top surface of the substrate is not additionally doped in the termination region.

FIG. 11A is a dopant profile of the active region in such an embodiment, where the dopant levels on the left side correspond to the bottom of the substrate. As seen, the bottom of the thinned substrate is a p+ type (>$10E19$ cm$^{-3}$), the middle portion of the substrate is a p-type, and the top of the substrate is a p+ type for high hole injection efficiency. The n-type dopant concentration of the n-type buffer layer 35 (FIG. 1) is shown on the right side of FIG. 11A.

Figure 11B:
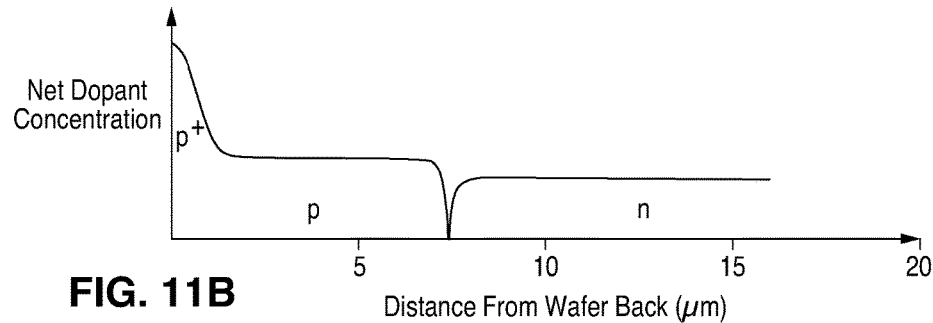
FIG. 11B is the doping profile vertically through the termination region of the die of FIG. 11A, where there is no additional p-type doping in the top surface of the substrate.

FIG. 11B is a dopant profile of the termination region in such an embodiment, where there is no extra doping of the top surface of the p-type substrate in the termination region, so there is low hole injection efficiency in the termination region.

The hole injection efficiency in the termination region can also be reduced by increasing the n-type dopant concentration of the n-type buffer layer 35 (FIG. 1) in the termination region.

Figure 12A:
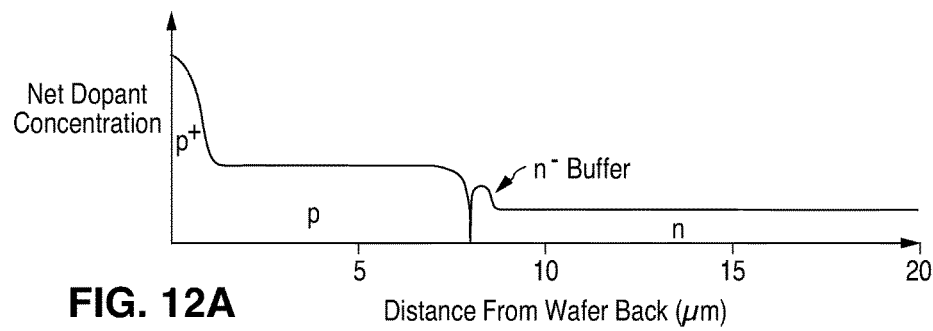
FIG. 12A is the doping profile vertically through the active region of a die, where the bottom surface of a relatively lightly doped intrinsic p-type substrate is doped with p-type dopants to form a p+ layer, rather than using a starting p+ substrate.

FIG. 12A is a dopant profile of the active region in such an embodiment, where the dopant levels on the left side correspond to the bottom of the substrate. In FIG. 12A, the n-type dopant concentration in the buffer layer 35 (FIG. 1) in the active region is conventional and optimized for breakdown voltage and on-resistance. The substrate is assumed to be a p-type where the top surface is not further doped and the bottom surface, after thinning, is doped p+ for good ohmic contact with the anode metal. Optionally, the top surface may be further doped in the active region as shown in FIG. 11A.

Figure 12B:
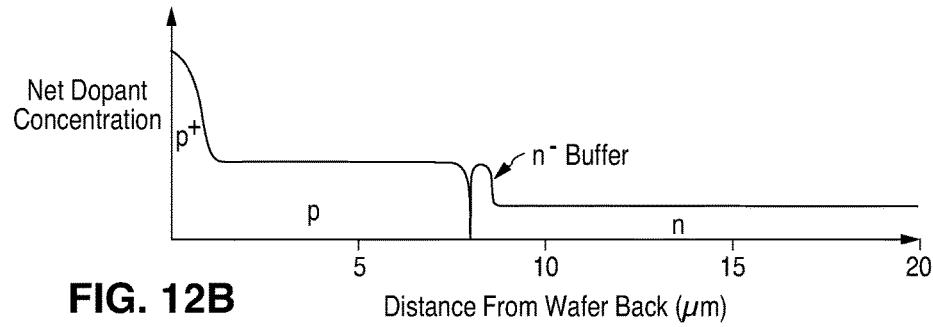
FIG. 12B is the doping profile vertically through the termination region of the die of FIG. 12A, where the top surface of the substrate is doped with n-type dopants in the termination region prior to growing the epitaxial layers.

FIG. 12B is a dopant profile of the termination region in such an embodiment, where the dopant levels on the left side correspond to the bottom of the substrate. In this case, the n-type buffer layer 35 (FIG. 1) is masked during growth to increase the n-type dopant concentration only in the termination region. Alternatively, n-type arsenic dopants may be shallow-implanted into the top surface of the p-type substrate in the termination region so the n-type dopants will up-diffuse into the n-type buffer layer 35 to increase the n-type dopant concentration in the termination region.

Figure 13:
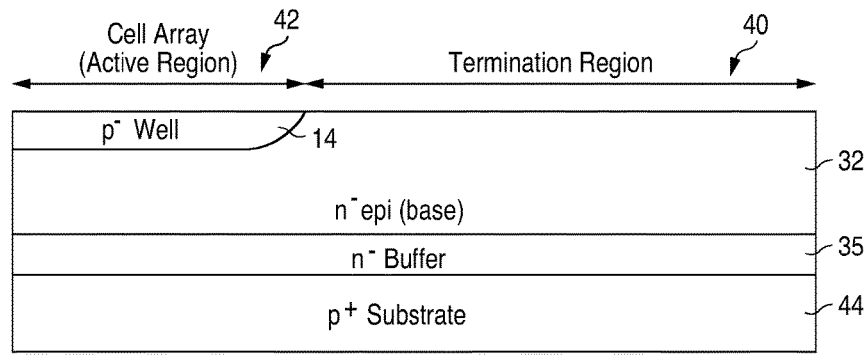
FIG. 13 is a simplified cross-sectional view of an insulated-gate switch die, without details of a cell array and termination structures, to better understand the doping profiles of FIGS. 14-17.

FIG. 13 is a simplified cross-section of an insulated-gate switch used to better understand the doping profiles of FIGS. 14-17. The relative doping concentrations are identified in FIGS. 14-17, and the y-axis is logarithmic. The approximate range of concentrations along the y-axis is about $10E13$ to $10E19$ cm$^{-3}$, and the range of distance along the x-axis is about 15 microns. Optimal concentrations and depths depend on the requirements of the device and can be determined by simulation. Termination structures and cells are not shown for simplicity. The starting substrate 44 is a p+ type.

Figure 14A:
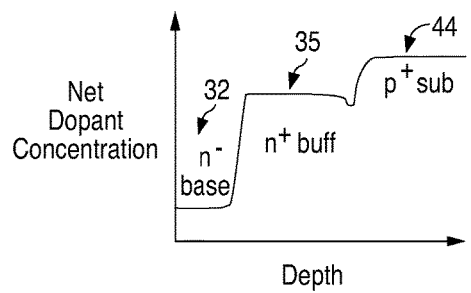
FIG. 14A is the doping profile vertically through the active region of the die of FIG. 13 prior to a thermal step.
Figure 14B:
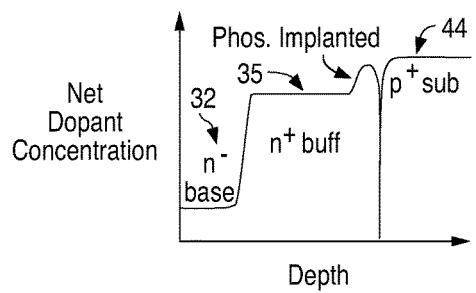
FIG. 14B is the doping profile vertically through the termination region of the die of FIG. 13 prior to a thermal step, where an n-type dopant implant into the top surface of the p+ type substrate is performed in the termination region to reduce hole injection efficiency in the termination region.

FIGS. 14A and 14B illustrate doping profiles for the active region 42 and termination region 40, respectively, after the n-type buffer layer 35 and n-epi layer 32 are grown but before a high temperature anneal step. The dopant profile in the active region 42 (FIG. 14A) may be that in the prior art device of FIG. 1. The dopant profile in the termination region 40 (FIG. 14B) is novel and shows an increased n-type dopant concentration in the n-type buffer layer 35 in the termination region 42 as a result of a masked n-type implant step where n-type phosphorus is implanted in the p+ type substrate 44 at a dose of $5E14$/cm$^2$ at 70 KeV.

Figure 15A:
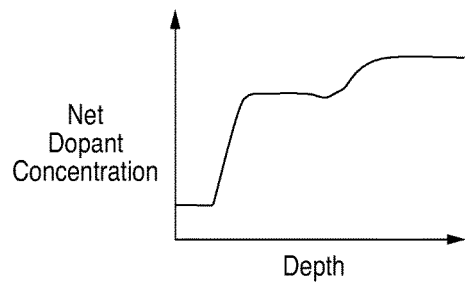
FIGS. 15A and 15B are the dopant profiles in the active region and termination region, respectively, after the dopants in FIGS. 14A and 14B are subjected to a thermal activation/drive-in step.
Figure 15B:
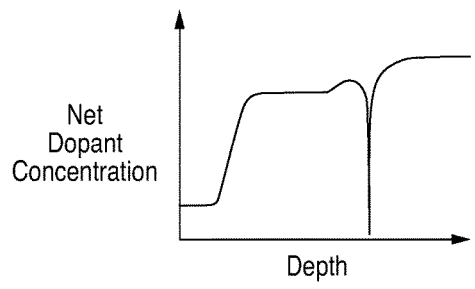

FIGS. 15A and 15B illustrate the same active region 42 and termination region 40, respectively, after a high temperature anneal step at the end of the wafer fabrication process. Note how the dopant concentrations have been smoothed out due to diffusion.

Figures 16A, 16B:
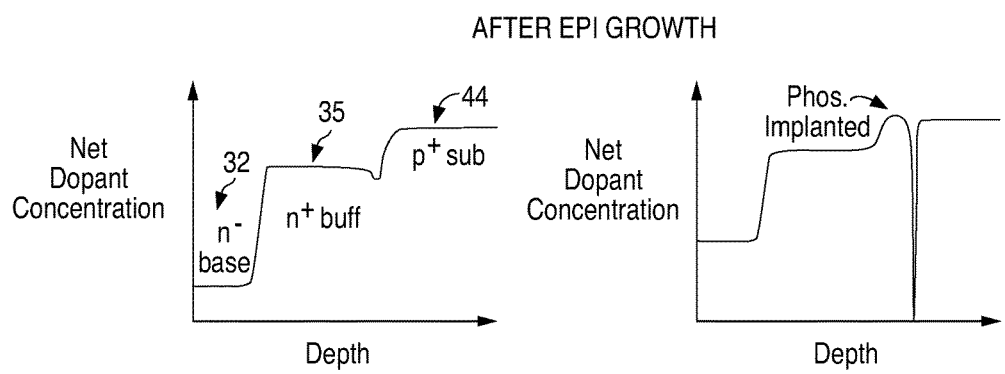
FIG. 16A is the doping profile vertically through the active region of the die of FIG. 13 prior to a thermal step.
FIG. 16B is the doping profile vertically through the termination region of the die of FIG. 13 prior to a thermal step, where an n-type dopant implant into the top surface of the p+ type substrate is performed in the termination region to reduce hole injection efficiency in the termination region. The dosage of the n-type dopants is about double that in FIG. 14B.

FIGS. 16A and 16B are similar to FIGS. 14A and 14B except that the dosage of phosphorus has been increased to $1E15$/cm$^2$ (twice the dosage as in FIGS. 14-15). FIGS. 16A and 16B show the dopant profiles of the active region 40 and termination region 40, respectively, after the epitaxial layer growth and before the high temperature anneal. Note the higher level of n-type dopant concentration in the n-type buffer layer 35 at the interface of the substrate 44 and buffer layer 35. As previously mentioned, the substrate 44 top surface may be doped n-type in the termination region so as to effectively form the lower portion of the n-type buffer layer 35.

Figures 17A, 17B:
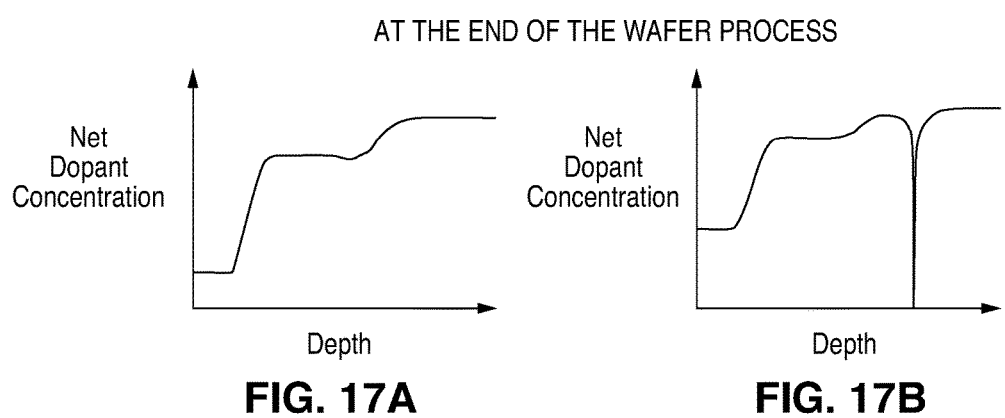
FIGS. 17A and 17B are the dopant profiles in the active region and termination region, respectively, after the dopants in FIGS. 16A and 16B are subjected to a thermal activation/drive-in step.

FIGS. 17A and 17B show the dopant profiles of the active region 40 and termination region 40, respectively, after the high temperature anneal.

Simulations may be used for determining the optimal implant depths and dosages.

Opposite conductivity type devices are formed by making dopant types the opposite of those describe above. Thus, the bottom of the device may be the cathode.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An insulated-gate switching device formed as a die comprising:
    a p-type substrate having a first p-type dopant concentration, the substrate having a top surface and a bottom surface;
    a first electrode formed on the bottom surface of the substrate;
    at least one epitaxial layer grown over the substrate;
    an array of cells having insulated gates formed in the epitaxial layer;
    first n-type regions formed in a top surface of the epitaxial layer, wherein biasing the gates above a threshold voltage creates a current path between the first n-type regions and the substrate;
    a second electrode formed overlying the epitaxial layer and electrically connected to the first n-type regions;
    a first portion of the device in an area of the array of cells and below the cells being an active region; and a second portion of the device surrounding the area of the array of cells and surrounding the area below the cells being a termination region;

wherein the substrate, at or near its top surface in the entire area of the termination region between the active region and an edge of the die, is doped differently from the top surface of the substrate in the active region to reduce an ability of the substrate in the termination region to inject holes into the at least one epitaxial layer, thus reducing hole injection efficiency in the termination region, and wherein the area of the termination region of the substrate that is doped differently is doped differently only partially through a thickness of the substrate, wherein a bottom surface of the substrate has a uniform dopant concentration.

2. The device of claim 1 wherein the substrate includes n-type dopants in the termination region.

3. The device of claim 1 wherein the substrate includes oxygen or nitrogen dopants in the termination region to form insulating regions in the substrate.

4. The device of claim 1 wherein the substrate is doped in the active region to increase its p-type dopant concentration above the first p-type dopant concentration in the active region.

5. The device of claim 1 wherein the array of cells comprises insulated gates that invert areas of the at least one epitaxial layer to control a current flow between the first electrode and the second electrode.

6. The device of claim 1 wherein the termination region comprises field limiting rings.

7. The device of claim 1 wherein the termination region extends to an edge of the die.

8. The device of claim 1 wherein the p-type substrate, at or near its top surface in the entire area of the termination region, is doped to have a net n-type conductivity.

9. An insulated-gate switching device formed as a die comprising:

a p-type substrate having a first p-type dopant concentration, the substrate having a top surface and a bottom surface;

a first electrode formed on the bottom surface of the substrate;

at least one epitaxial layer grown over the substrate;

an array of cells having insulated gates formed in the epitaxial layer;

first n-type regions formed in a top surface of the epitaxial layer, wherein biasing the gates above a threshold voltage creates a current path between the first n-type regions and the substrate;

a second electrode formed overlying the epitaxial layer and electrically connected to the first n-type regions;

a first portion of the device in an area of the array of cells and below the cells being an active region; and a second portion of the device surrounding the area of the array of cells and surrounding the area below the cells being a termination region;

wherein the substrate, at or near its top surface in the entire area of the termination region, is doped differently from the top surface of the substrate in the active region to reduce an ability of the substrate in the termination region to inject holes into the at least one epitaxial layer, thus reducing hole injection efficiency in the termination region, and wherein the p-type substrate, at or near its top surface in the entire area of the termination region, is doped to have a net p-type conductivity, such that the net p-type dopant concentration less than a p-type dopant concentration in the active region.

* * * * *